US011714110B2

(12) United States Patent
Nakahara

(10) Patent No.: US 11,714,110 B2
(45) Date of Patent: Aug. 1, 2023

(54) DETECTOR TO DETECT INPUT VOLTAGE OUTSIDE A GUARANTEED OPERATING RANGE

(71) Applicant: SONY SEMICONDUCTOR SOLUTIONS CORPORATION, Kanagawa (JP)

(72) Inventor: Hironori Nakahara, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/427,936

(22) PCT Filed: Jan. 8, 2020

(86) PCT No.: PCT/JP2020/000211
§ 371 (c)(1),
(2) Date: Aug. 3, 2021

(87) PCT Pub. No.: WO2020/166234
PCT Pub. Date: Aug. 20, 2020

(65) Prior Publication Data
US 2022/0026473 A1    Jan. 27, 2022

(30) Foreign Application Priority Data

Feb. 12, 2019  (JP) ................. 2019-022296

(51) Int. Cl.
*G01R 19/165*    (2006.01)
(52) U.S. Cl.
CPC ................. *G01R 19/1659* (2013.01)
(58) Field of Classification Search
CPC .......... G01R 19/1659; G01R 19/16576; G01R 19/16552; H01L 21/82; H01L 21/822; H01L 27/04
See application file for complete search history.

(56) References Cited

U.S. PATENT DOCUMENTS

| 5,994,790 | A  | 11/1999 | Nagashima et al. |
| 2004/0183613 | A1 | 9/2004 | Kurd et al. |
(Continued)

FOREIGN PATENT DOCUMENTS

| CN | 109690952 A | 4/2019 |
| JP | 1-216271 A | 8/1989 |
(Continued)

OTHER PUBLICATIONS

International Search Report and Written Opinion of PCT Application No. PCT/JP2020/000211, dated Apr. 7, 2020, 11 pages of ISRWO.

(Continued)

*Primary Examiner* — Feba Pothen
(74) *Attorney, Agent, or Firm* — Chip Law Group

(57) ABSTRACT

The present technology is to provide a detector capable of detecting an input voltage outside the guaranteed operating voltage range, even if the delay time caused in a logic element by a decrease in power-supply voltage varies due to an external factor. The detector includes a plurality of first detection circuits, a first detection rate calculation unit, a plurality of second detection circuits, a second detection rate calculation unit, and a comparison determination unit. Each of the plurality of first detection circuits detects whether or not an input voltage has a value outside a guaranteed operating range for a normal operation. The first detection rate calculation unit calculates a first detection rate of the detected number of the first detection circuits, and each of the plurality of second detection circuits detects whether or not a predetermined reference voltage is lower than a threshold voltage.

6 Claims, 5 Drawing Sheets

(56) References Cited

U.S. PATENT DOCUMENTS

| | | | |
|---|---|---|---|
| 2009/0058452 A1* | 3/2009 | Tanaka | G01R 31/31901 324/764.01 |
| 2011/0074398 A1 | 3/2011 | Barton et al. | |
| 2015/0015283 A1 | 1/2015 | Park et al. | |
| 2015/0022240 A1* | 1/2015 | Soraoka | G06F 1/3212 327/76 |
| 2015/0102833 A1 | 4/2015 | Bhatia | |
| 2017/0184688 A1* | 6/2017 | Nakamura | G01R 33/07 |

FOREIGN PATENT DOCUMENTS

| | | |
|---|---|---|
| JP | 6-130093 A | 5/1994 |
| JP | 10-282159 A | 10/1998 |
| JP | 11-311654 A | 11/1999 |
| JP | 2018-078357 A | 5/2018 |
| KR | 10-2005-0112109 A | 11/2005 |
| TW | 201512684 A | 4/2015 |

OTHER PUBLICATIONS

Gomina, et al., "Power supply glitch attacks: design and evaluation of detection circuit", Proceedings of the 2014 IEEE International Symposium on Hardware-Oriented Security and Trust (HOST), 2014, pp. 136-141.

* cited by examiner

DETECTOR TO DETECT INPUT VOLTAGE OUTSIDE A GUARANTEED OPERATING RANGE

CROSS REFERENCE TO RELATED APPLICATIONS

This application is a U.S. National Phase of International Patent Application No. PCT/JP2020/000211 filed on Jan. 8, 2020, which claims priority benefit of Japanese Patent Application No. JP 2019-022296 filed in the Japan Patent Office on Feb. 12, 2019. Each of the above-referenced applications is hereby incorporated herein by reference in its entirety.

TECHNICAL FIELD

The present technology relates to detectors, and more particularly, to a logic detector using digital detection circuits.

BACKGROUND ART

In a semiconductor device (an integrated circuit) in which a central processing unit (CPU), a digital signal processor (DSP), and the like are mounted, the guaranteed operating voltage for a logic circuit is determined, with the power-supply droop during an operation of the logic circuit being taken into consideration.

In recent years, to lower power consumption in semiconductor devices (integrated circuits), there has been a demand for lowering the guaranteed operating voltage in semiconductor devices (integrated circuits) to the minimum. Therefore, in a case where the voltage supplied to a logic circuit is outside the guaranteed operating range, a circuit that detects the supplied voltage outside the guaranteed operating range is required.

Here, a phenomenon called power-supply droop in which the voltage input to a semiconductor device (an integrated circuit) temporarily fluctuates is known. As a means to detect a power-supply droop, a means to perform detection using an analog circuit is known.

However, in a case where a power-supply droop is to be detected with an analog circuit, the responsiveness of the amplifier is poor, and a fast power-supply droop cannot be detected in some cases. On the other hand, if the response speed of the amplifier is increased, power consumption (current consumption) might increase.

Therefore, in recent years, a means to detect a power-supply droop with a logic circuit (a digital circuit) has been considered (Non-Patent Document 1, for example).

CITATION LIST

Patent Document

Non-Patent Document 1: Kamil Gomina, Jean-Baptiste Rigaud, Philippe Gendrier, Philippe Candelier, and Assia Tria, "Power supply glitch attacks: design and evaluation of detection circuit", "2014 IEEE International Symposium on Hardware-Oriented Security and Trust (HOST)", 2014, 139-140, FIGS. 6-8

SUMMARY OF THE INVENTION

Problems to be Solved by the Invention

Non-Patent Document 1 discloses a detection circuit that detects glitch voltage. Glitch voltage in this specification refers to an unexpected or undesired fluctuation caused in the power-supply voltage by an operation of an internal circuit or an external factor. A detection circuit uses the delay time caused in a logic element by a decrease in the power-supply voltage, to intentionally cause a flip-flop setup violation or a hold violation to detect glitch voltage.

However, a delay time in a logic element depends on process and temperature, and there is variation in the insides of individual semiconductor devices (integrated circuits). Therefore, it is difficult to control the delay time to be caused in a logic element by a decrease in the power-supply voltage. As a result, variation exists in the detection voltage of a detection circuit.

The present technology has been made in view of such circumstances, and its principal objective is to provide a detector capable of accurately detecting an input voltage outside the guaranteed operating voltage range, even if the delay time caused in a logic element by a decrease in power-supply voltage varies due to an external factor.

Solutions to Problems

The present inventor made intensive studies to achieve the above objective. As a result, the present inventor succeeded in accurately detecting an input voltage outside the guaranteed operating voltage range, even if the delay time caused in a logic element by a decrease in power-supply voltage varies due to an external factor. Thus, the present inventor completed the present technology.

Specifically, the present technology provides a detector that includes:
a plurality of first detection circuits;
a first detection rate calculation unit;
a plurality of second detection circuits;
a second detection rate calculation unit; and
a comparison determination unit,
in which each first detection circuit of the plurality of first detection circuits detects whether or not an input voltage supplied to a processing circuit has a value outside a guaranteed operating range in which a normal operation is performed at the processing circuit;
the first detection rate calculation unit counts the number of the first detection circuits that have detected that the input voltage has a value outside the guaranteed operating range, and calculates a first detection rate of the detected number of the first detection circuits with respect to the total number of the plurality of first detection circuits,
each second detection circuit of the plurality of second detection circuits detects whether or not a predetermined reference voltage supplied is lower than a threshold voltage for determining the guaranteed operating range,
the second detection rate calculation unit counts the number of the second detection circuits that have detected that the predetermined reference voltage is lower than the threshold voltage, and calculates a second detection rate of the detected number of the second detection circuits with respect to the total number of the plurality of second detection circuits, and
the comparison determination unit compares the first detection rate and the second detection rate, and, when the first detection rate is substantially equal to or higher than the second detection rate, determines the value of the input voltage to be equal to or smaller than the value of the threshold voltage.

In the detector according to the present technology, when the first detection rate and the second detection rate are substantially equal, the comparison determination unit determines that the value of the input voltage and the value of the threshold voltage may be substantially equal.

In the detector according to the present technology, each first detection circuit of the plurality of first detection circuits may be formed with a first logic circuit group, each second detection circuit of the plurality of second detection circuits may be formed with a second logic circuit group, and the first logic circuit group and the second logic circuit group may have substantially the same configuration.

Further, in the detector according to the present technology, the first logic circuit group and the second logic circuit group may each include a first flip-flop, a second flip-flop, and a delay element, and the delay element may be disposed between an output of the first flip-flop and an input of the second flip-flop.

The detector according to the present technology may further include a reference voltage generation circuit, in which the input voltage may be a power-supply voltage, the reference voltage generation circuit may generate the predetermined reference voltage from the power-supply voltage supplied, each first detection circuit of the plurality of first detection circuits may operate with a clock having a frequency substantially equal to a system clock for operating the processing circuit, each second detection circuit of the plurality of second detection circuits may operate with a clock having a lower frequency than the system clock, and the comparison determination unit may operate with a clock having a frequency substantially equal to the system clock, and compare the first detection rate and the second detection rate.

The detector according to the present technology may further include a reference voltage generation circuit, in which the input voltage may be a power-supply voltage, and be also supplied to the reference voltage generation circuit, the reference voltage generation circuit may generate the predetermined reference voltage from the input voltage, each first detection circuit of the plurality of first detection circuits may operate with a clock having a frequency substantially equal to a system clock for operating the processing circuit, each second detection circuit of the plurality of second detection circuits may operate with a clock having a frequency substantially equal to the system clock, when the power-supply voltage fluctuates, the first detection rate calculation unit may calculate the first detection rate on the basis of the power-supply voltage after the power-supply voltage fluctuates, and the second detection rate calculation unit may calculate the second detection rate on the basis of the power-supply voltage before the power-supply voltage fluctuates; and the comparison determination unit may operate with a clock having a frequency substantially equal to the system clock, and compare the first detection rate calculated on the basis of the power-supply voltage after the power-supply voltage fluctuates, with the second detection rate calculated on the basis of the power-supply voltage before the power-supply voltage fluctuates.

According to the present technology, a detector can detect an input voltage outside the guaranteed operating voltage range, even if the delay time caused in a logic element by a decrease in power-supply voltage varies due to an external factor. Note that effects of the present technology are not limited to the above effect, and may include any of the effects described in the present technology.

MODES FOR CARRYING OUT THE INVENTION

Figure 1:
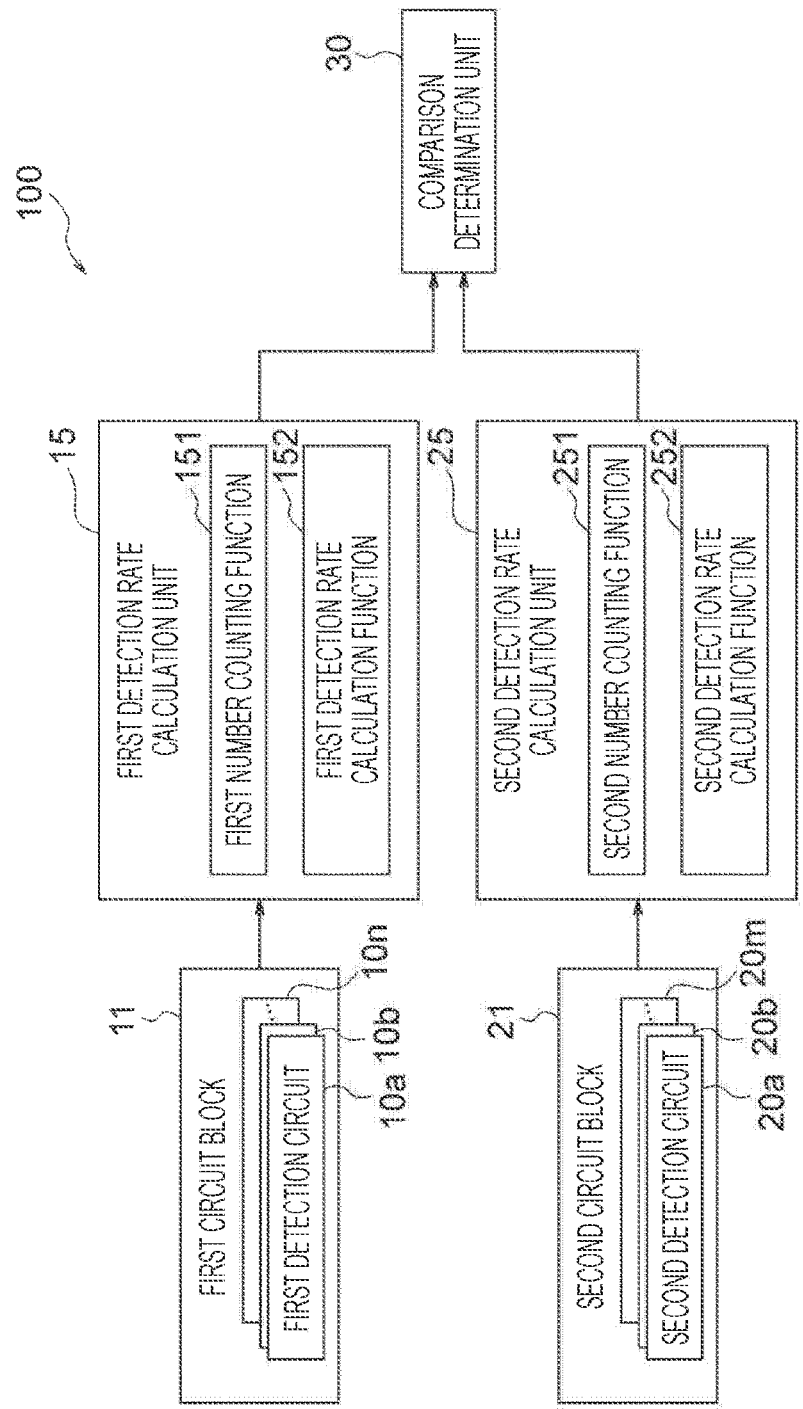
FIG. 1 is a block diagram showing an example configuration of a logic detector that is an example of a detector of a first embodiment according to the present technology.

The following is a description of preferred embodiments for carrying out the present technology, with reference to the accompanying drawings. Note that the embodiments described below are typical examples of embodiments of the present technology, and do not narrow the interpretation of the scope of the present technology.

Note that explanation will be made in the following order.
1. Outline of the present technology
2. First embodiment (Example 1 of a detector)
3. Second embodiment (Example 2 of a detector)
4. Third embodiment (Example 3 of a detector)

1. Outline of the Present Technology

In a conventional means to detect glitch voltage with an analog circuit, when a power-supply droop is to be detected, the responsiveness of the amplifier is poor, and a fast power-supply droop cannot be detected in some cases. Note that a fast power-supply droop means a power-supply droop in which voltage drops instantaneously. Further, if the response speed of the amplifier is increased, power consumption (current consumption) might increase. On the other hand, in a means to detect a power-supply droop with a logic circuit, a flip-flop setup violation or a hold violation is intentionally caused with a delay time in the logic element, and thus, glitch circuit is detected.

However, a delay time in a logic element depends on process and temperature, and there is variation in the insides of individual semiconductor devices (integrated circuits). Therefore, it is difficult to control the delay time to be caused in a logic element by a decrease in the power-supply voltage. As a result, variation exists in the detection voltage of a detection circuit.

Further, there might be variations in the temperature dependence of the individual devices (semiconductor devices, for example), and, even if the detection voltage is trimmed through inspection at a temperature of a specific voltage in a mass production process, the temperature characteristics of the detection voltage might still vary with the individual devices. Therefore, in a semiconductor device (an integrated circuit), it might be difficult to guarantee operations at all temperatures.

The present technology has been made in view of such circumstances, and its principal objective is to provide a detector capable of accurately detecting an input voltage outside the guaranteed operating voltage range, even if the delay time caused in a logic element by a decrease in power-supply voltage varies due to an external factor.

2. First Embodiment (Example 1 of a Power Supply Circuit)

A detector of a first embodiment according to the present technology is a detector that includes a plurality of first detection circuits, a first detection rate calculation unit, a plurality of second detection circuits, a second detection rate calculation unit, and a comparison determination unit. In the detector, each of the plurality of first detection circuits detects whether or not an input voltage supplied to a processing circuit has a value outside a guaranteed operating range in which a normal operation is performed at the processing circuit. The first detection rate calculation unit counts the number of the first detection circuits that have detected that the input voltage has a value outside the guaranteed operating range, and calculates a first detection rate of the detected number of the first detection circuits with respect to the total number of the plurality of first detection circuits. Each of the plurality of second detection circuits detects whether or not a predetermined reference voltage supplied is lower than a threshold voltage for determining the guaranteed operating range. The second detection rate calculation unit counts the number of the second detection circuits that have detected that the predetermined reference voltage is lower than the threshold voltage, and calculates a second detection rate of the detected number of the second detection circuits with respect to the total number of the plurality of second detection circuits. The comparison determination unit compares the first detection rate and the second detection rate, and, when the first detection rate is substantially equal to or higher than the second detection rate, determines the value of the input voltage to be equal to or smaller than the value of the threshold voltage.

With the detector of the first embodiment according to the present technology, even if the delay time caused in a logic element by a decrease in power-supply voltage varies due to an external factor, it is possible to accurately detect an input voltage outside the guaranteed operating voltage range.

Configuration of a Logic Detector

FIG. 1 shows a logic detector 100 that is an example of a detector of the first embodiment according to the present technology. FIG. 1 is a block diagram showing an example configuration of the logic detector 100 to which the present technology is applied.

As shown in FIG. 1, the logic detector 100 of the first embodiment according to the present technology includes a first circuit block 11, a first detection rate calculation unit 15, a second circuit block 21, a second detection rate calculation unit 25, and a comparison determination unit 30.

The first circuit block 11 includes a first detection circuit 10a, a first detection circuit 10b, . . . , and a first detection circuit 10n. Each of the plurality of first detection circuits (the first detection circuit 10a, the first detection circuit 10b, . . . , and the first detection circuit 10n) detects whether or not an input voltage supplied to a processing circuit (not shown) has a value outside a guaranteed operating range for a normal operation in the processing circuit (not shown).

Note that the guaranteed operating range in the processing circuit (not shown) can be set at 1.5 [V] to 0.6 [V], for example.

Note that, in a case where there is no need to identify each one of the plurality of first detection circuits (the first detection circuit 10a, the first detection circuit 10b, . . . , and the first detection circuit 10n), a first detection circuit will be referred to simply as a first detection circuit 10. Further, the number of the first detection circuits 10 included in the first circuit block 11 is not limited to any particular number, and is several tens or more, for example.

Figure 2:
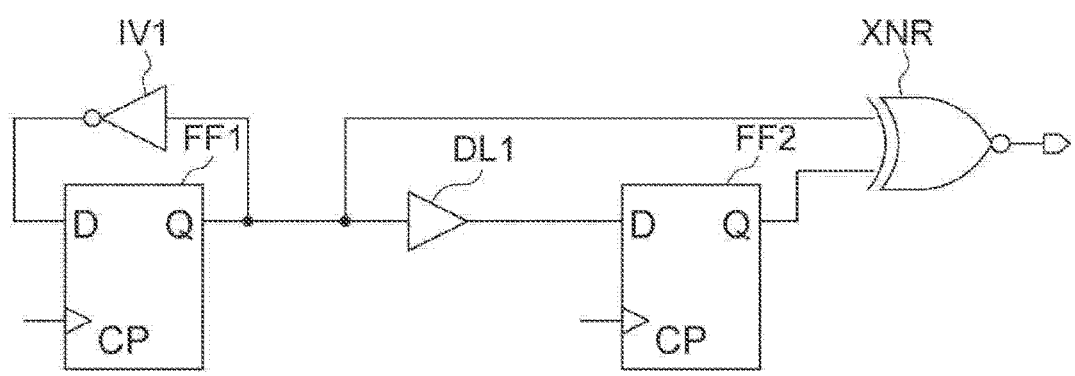
FIG. 2 is a block diagram showing an example configuration of a first detection circuit in the logic detector of the first embodiment according to the present technology.

Each of the plurality of first detection circuits 10 is formed with a first logic circuit group. FIG. 2 shows a first detection circuit 10. FIG. 2 is a block diagram showing an example configuration of a first detection circuit 10 in the logic detector 100 of the first embodiment according to the present technology. Note that this example configuration of a first detection circuit 10 is an example, and other configurations can be applied.

As shown in FIG. 2, a first detection circuit 10 of the first embodiment according to the present technology includes a first flip-flop FF1, an inverter IV1, a second flip-flop FF2, a delay element DL1, and an exclusive NOR XNR.

The output of the first flip-flop FF1 is connected to the input of the first flip-flop FF1 via the inverter IV1. With this arrangement, the output of the first flip-flop FF1 repeatedly switches between "H" and "L", every time a clock pulse is applied to the first flip-flop FF1.

The delay element DL1 is disposed between the output of the first flip-flop FF1 and the input of the second flip-flop FF2. The delay element DL1 delays the output of the first flip-flop FF1 by the amount equivalent to a predetermined time.

The output of the first flip-flop FF1 and the output of the second flip-flop FF2 are input to the exclusive NOR XNR. The exclusive NOR XNR reflects the temperature characteristics of the first flip-flop FF1, the second flip-flop FF2, and the delay element DL1, and outputs a value indicating that the output of the first flip-flop FF1 and the output of the second flip-flop FF2 are the same values.

For example, if the output of the first flip-flop FF1 and the output of the second flip-flop FF2 are the same values at "H" or "L", the output of the exclusive NOR XNR is "true". In a case where the output of the first flip-flop FF1 and the output of the second flip-flop FF2 are not the same values, or are different at "H" and "L", on the other hand, the output of the exclusive NOR XNR is "false".

Therefore, the setup time and hold time of the second flip-flop FF2, and the delay time of the delay element DL1 are adjusted, so that each of the plurality of first detection circuits 10 can change its detection voltage.

With the above configuration as an example, each of the plurality of first detection circuits 10 detects whether or not the input voltage supplied to the processing circuit (not shown) has a value outside the guaranteed operating range in which a normal operation is performed at the processing circuit (not shown).

Note that the processing circuit is hardware designed to read a program, data, and the like, and perform arithmetic processing, such as a central processing unit (CPU), a digital signal processing unit (DSP), an application specific integrated circuit (ASIC), or a filed programmable gate array (FPGA).

The first detection rate calculation unit 15 includes a first number counting function 151 and a first detection rate calculation function 152. The first number counting function 151 counts the number of the first detection circuits 10 that have detected that the input voltage has a value outside the guaranteed operating range. The first detection rate calculation function 152 calculates a first detection rate of the number of the first detection circuits 10 that have detected that the input voltage has a value outside the guaranteed operating range, with respect to the total number of the plurality of first detection circuits 10.

The second circuit block 21 includes a second detection circuit 20a, a second detection circuit 20b, . . . , and a second detection circuit 20m. Each of the plurality of second detection circuits (the second detection circuit 20a, the second detection circuit 20b, . . . , and the second detection circuit 20m) detects whether or not the supplied predetermined reference voltage is lower than a threshold voltage for determining the guaranteed operating range. Note that the threshold voltage can be set at 0.6 [V], for example.

Note that, in a case where there is no need to identify each one of the plurality of second detection circuits (the second detection circuit 20a, the second detection circuit 20b, . . . , and the second detection circuit 20m), a second detection circuit will be referred to simply as a second detection circuit 20. Further, the number of the second detection circuits 20 included in the second circuit block 21 is not limited to any particular number, and is several tens or more, for example. Furthermore, the number of the second detection circuits 20 may be the same as the number of the first detection circuits 10, or may be different.

Each of the plurality of second detection circuits 20 is formed with a second logic circuit group. To minimize the relative error in the delay time of the logic elements (flip-flops, delay elements, and the like, for example) in the same integrated circuit, the second logic circuit group has substantially the same configuration as the first logic circuit group. Note that the substantially same configuration means that the second logic circuit group has not only the same circuit configuration as the first logic circuit group, but also has a circuit configuration in which the relative error in a predetermined delay time with respect to the first logic circuit group is within a range of 90% to 110%, though the circuit configuration of the second logic circuit group differs from the first logic circuit group, for example.

A second detection circuit 20 has a configuration similar to that of the first detection circuit 10 shown in FIG. 2, and includes a first flip-flop FF1, an inverter IV1, a second flip-flop FF2, a delay element DL1, and an exclusive NOR XNR.

The output of the first flip-flop FF1 is connected to the input of the first flip-flop FF1 via the inverter IV1. With this arrangement, the output of the first flip-flop FF1 repeatedly switches between "H" and "L", every time a clock pulse is applied to the first flip-flop FF1.

The delay element DL1 is disposed between the output of the first flip-flop FF1 and the input of the second flip-flop FF2. The delay element DL1 delays the output of the first flip-flop FF1 by the amount equivalent to a predetermined time.

The output of the first flip-flop FF1 and the output of the second flip-flop FF2 are input to the exclusive NOR XNR. The exclusive NOR XNR reflects the temperature characteristics of the first flip-flop FF1, the second flip-flop FF2, and the delay element DL1, and outputs a value indicating that the output of the first flip-flop FF1 and the output of the second flip-flop FF2 are the same values.

For example, if the output of the first flip-flop FF1 and the output of the second flip-flop FF2 are the same values at "H" or "L", the output of the exclusive NOR XNR is "true". In a case where the output of the first flip-flop FF1 and the output of the second flip-flop FF2 are not the same values, or are different at "H" and "L", on the other hand, the output of the exclusive NOR XNR is "false".

Therefore, the setup time and hold time of the second flip-flop FF2, and the delay time of the delay element DL1 are adjusted, so that each of the plurality of second detection circuits 20 can change its detection voltage.

Having the above configuration as an example, each of the plurality of second detection circuits 20 detects whether or not the supplied predetermined reference voltage is lower than the threshold voltage for determining the guaranteed operating range.

The second detection rate calculation unit 25 includes a second number counting function 251 and a second detection rate calculation function 252. The second number counting function 251 counts the number of the second detection circuits 20 that have detected that the predetermined reference voltage is lower than the threshold voltage. The second detection rate calculation function 252 calculates a second detection rate of the number of the second detection circuits that have detected that the predetermined reference voltage is lower than the threshold voltage, with respect to the total number of the plurality of second circuit blocks 20.

The comparison determination unit 30 compares the first detection rate and the second detection rate, and, when the first detection rate is substantially equal to or higher than the second detection rate, determines the value of the input voltage to be equal to or smaller than the value of the threshold voltage.

Also, when the first detection rate and the second detection rate are substantially equal, the comparison determination unit 30 can determine the value of the input voltage to be substantially equal to the value of the threshold voltage.

Next, the characteristics of the first circuit block 11 and the second circuit block 21 are described.

Figure 3:
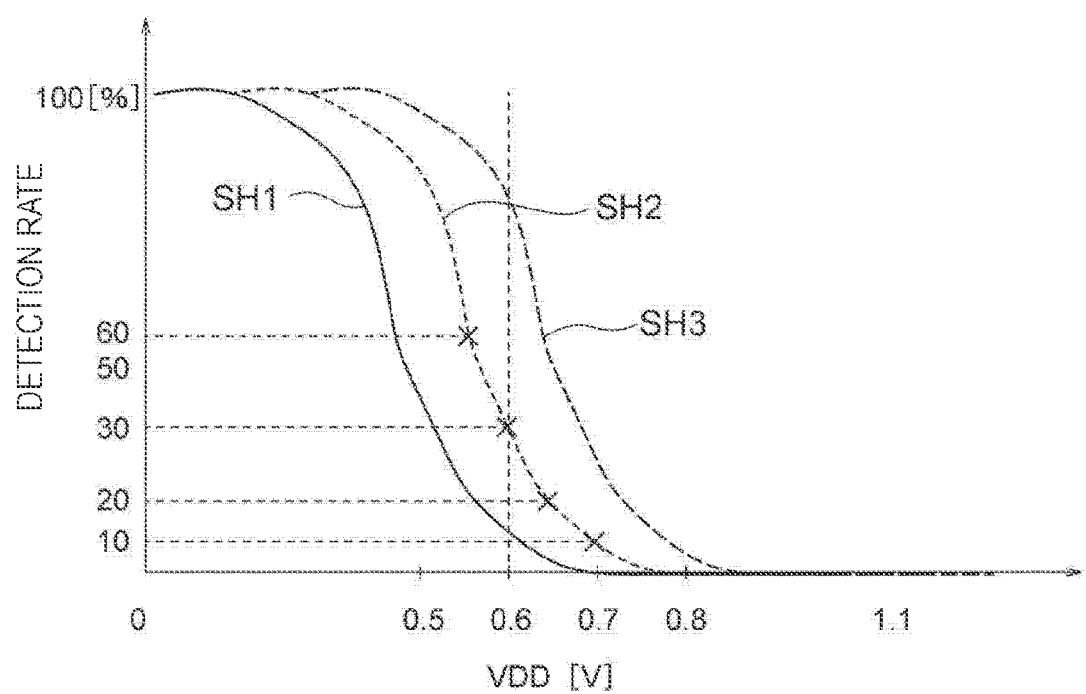
FIG. 3 is a characteristics chart showing detection rate distributions of a second circuit block in the logic detector of the first embodiment according to the present technology.

FIG. 3 shows the detection rate distribution of the second circuit block 21 included in the logic detector 100. FIG. 3 is a characteristics chart showing detection rate distributions of detection rates of the second circuit block 21 in the logic detector 100 of the first embodiment according to the present technology.

Normally, a threshold voltage detection rate varies with the temperature of the logic detector 100 (a semiconductor device or an integrated circuit) in which the second circuit block 21 is mounted, and the process in the logic detector 100 (a semiconductor device or an integrated circuit) in which the second circuit block 21 is mounted. Note that the process means the characteristics of a complementary metal oxide semiconductor (CMOS) in the manufacturing process.

The characteristics of a CMOS mean variation in the threshold voltage Vth of the CMOS, for example. That is, when the threshold voltage Vth of a CMOS changes, the response time and threshold voltage of the logic element change, and as a result, the setup times and hold times of the flip-flops fluctuate. Normally, there may be variation in a semiconductor chip or between chips. However, the variation is small between adjacent logic elements in a semiconductor chip, while the variation between chips is greater than the variation between adjacent logic elements. Further, the variation between chips includes variation between chips in the same wafer and variation between different wafers, and the variation between different wafers is normally greater than the variation between chips in the same wafer.

Accordingly, the level of variation in a semiconductor chip and between chips is the lowest between adjacent logic elements in a semiconductor chip, while the variation between different wafers is greater than the variation between chips in the same wafer.

Therefore, the logic detector 100 forms the first circuit block 11 and the second circuit block 21 in the same semiconductor device (the same integrated circuit). That is, the first circuit block 11 is mounted in the semiconductor device (integrated circuit) in which the second circuit block 21 is mounted. With this arrangement, the process in the first circuit block 11 is the same as the process in the second circuit block 21.

Therefore, in the semiconductor device (integrated circuit) in which the first circuit block 11 and the second circuit block 21 are mounted, the first circuit block 11 and the second circuit block 21 are in the same chip (the same integrated circuit), and accordingly, the processes are the same. For example, the detection voltage variation distributions generated by at least the variation caused in the delay time of a logic element (the delay element DL1) by a decrease in the power-supply voltage, or the variation in setup times and hold times of the flip-flops (the first flip-flop FF1 and the second flip-flop FF2) can be considered to be the same.

Also, the temperature of the first circuit block 11 and the temperature of the second circuit block 21 can be considered to be the same. Accordingly, the temperature characteristics of the first circuit block 11 and the temperature characteristics of the second circuit block 21 can be considered to be the same.

Thus, the detection rate distribution of the first circuit block 11 is substantially equal to the detection rate distribution of the second circuit block 21. In the description below, the distribution characteristics of the detection rate of the second circuit block 21 is described, with reference to FIG. 3. Note that substantially equal detection rate distributions may mean the same detection rate distributions, or mean that the detection rate distributions match 90% or higher, for example.

In FIG. 3, a first reference detection rate SH1 indicates the temperature characteristics in a case where the temperature of the semiconductor device (the logic detector 100) is 20 degrees C. while the threshold voltage is 0.6 [V], for example. A second reference detection rate SH2 indicates the temperature characteristics in a case where the temperature of the semiconductor device (the logic detector 100) is 30 degrees C. Further, a third reference detection rate SH3 indicates the temperature characteristics in a case where the temperature of the semiconductor device (the logic detector 100) is 40 degrees C.

Here, the second reference detection rate SH2 having the temperature characteristics in a case where the temperature is 20 degrees C. is described. For example, a reference voltage is supplied to the second circuit block 21 of the semiconductor device (the logic detector 100), and some of the dozens of second detection circuits 20 detect that the reference voltage is lower than the threshold voltage of 0.6 [V].

The second detection rate calculation unit 25 counts the number of the second detection circuits that have detected that the supplied reference voltage is lower than the threshold voltage of 0.6 [V], using the second number counting function 251. The second detection rate calculation unit 25 uses the second detection rate calculation function 252, to calculate the second detection rate of the number of the second detection circuits 20 that have detected that the threshold voltage is lower than the threshold voltage of 0.6 [V], with respect to the total number of the plurality of second detection circuits 20.

In FIG. 3, each of the plurality of second detection circuits 20 does not detect that the input voltage is lower than 0.6 [V] while the input voltage is 1.1 [V] to 0.8 [V], for example, and therefore, the second detection rate is 0%. The supplied input voltage then becomes lower than 0.8 [V], and a predetermined number of second detection circuits 20 detect that the input voltage is lower than the threshold voltage of 0.6 [V] when the input voltage is 0.7 [V], for example. Therefore, the second detection rate is 10% at this point. Further, when the input voltage is 0.65 [V], a predetermined number of second detection circuits 20 detect that the input voltage is lower than the threshold voltage of 0.6 [V], and the second detection rate is 20%. Likewise, when the input voltage is 0.6 [V], the second detection rate is 30%. Further, when the input voltage is 0.55 [V], the second detection rate is 60%.

As described above, the reference voltage is supplied to the second circuit block 21, and the second detection rate calculation unit 25 calculates the second detection rate of the number of the second detection circuits 20 that have detected that the supplied reference voltage is lower than the threshold voltage of 0.6 [V], with respect to the total number of the plurality of second detection circuits 20.

Thus, the second detection rate calculation unit 25 can calculate the detection rate for each reference voltage at a predetermined temperature (30 degrees C., for example) in the semiconductor device (the logic detector 100).

Operation of the Logic Detector

Next, operation of the logic detector 100 is described. The first circuit block 11 is disposed in the processing circuit (not shown) such as a CPU or DSP, for example. The first circuit block 11 monitors the input voltage being supplied to the processing circuit (not shown).

First, each of the plurality of first detection circuits 10 included in the first circuit block 11 detects whether or not the input voltage supplied to the processing circuit (not shown) has a value outside the guaranteed operating range in which a normal operation is performed at the processing circuit (not shown).

The first detection rate calculation unit 15 counts the number of the first detection circuits 10 that have detected that the input voltage has a value outside the guaranteed operating range, using the first number counting function 151. The first detection rate calculation unit 15 then uses the first detection rate calculation function 152, to calculate the first detection rate of the detected number of the first detection circuits 10 with respect to the total number of the plurality of first detection circuits 10.

Here, the total number of the plurality of first detection circuits 10 is 100, for example. Further, the guaranteed operating range (rated value) for the processing circuit (not shown) is from 1.5 [V] to 0.6 [V], for example. Note that the guaranteed operating range (rated value) means the voltage at which the processing circuit can be used in a stable manner, and is set with some margin allowed. Therefore, even if the guaranteed operating range (rated value) is exceeded, the processing circuit can be used temporarily.

Each of the plurality of first detection circuits 10 is synchronized with the system clock of the processing circuit (not shown), and detects whether or not the input voltage supplied to the processing circuit (not shown) has a value outside the guaranteed operating range in which a normal operation is performed at the processing circuit (not shown). Note that the temperature of the processing circuit (not shown) is 30 degrees C., and the distribution characteristics of the second reference detection rate SH2 shown in FIG. 3 are applied.

For example, in a case where the input voltage is 0.8 [V], none of the 100 first detection circuits 10 detects that the input voltage is outside the guaranteed operating range, and accordingly, the first detection rate calculation unit 15 calculates the first detection rate to be 0%.

When the input voltage temporarily drops from 0.8 [V], for example, each of the 100 first detection circuits 10 then detects whether or not the input voltage supplied to the processing circuit (not shown) has a value (0.6 [V]) outside the guaranteed operating range in which a normal operation is performed at the processing circuit (not shown).

When detecting that 20 first detection circuits 10 of the 100 first detection circuits 10 have detected that the input voltage has a value (0.6 [V]) outside the guaranteed operating range, for example, the first detection rate calculation unit 15 calculates the first detection rate to be 20%. Further, when detecting that 30 first detection circuits 10 of the 100 first detection circuits 10 have detected that the input voltage has a value (0.6 [V]) outside the guaranteed operating range, for example, the first detection rate calculation unit 15 calculates the first detection rate to be 30%.

The comparison determination unit 30 compares the first detection rate of the first detection rate calculation unit 15 with the second detection rate of the second detection rate calculation unit 25, in synchronization with the system clock supplied to the processing circuit (not shown). When the first detection rate is substantially equal to or higher than the second detection rate, the comparison determination unit 30 then determines the value of the input voltage to be equal to or smaller than the value of the threshold voltage (0.6 [V]).

Note that the system clock input to the processing circuit (not shown) is also input to the second circuit block 21, and each of the plurality of second detection circuits 20 is synchronized with the system clock of the processing circuit (not shown).

Here, in a case where the threshold voltage is 0.6 [V], for example, the second detection rate calculation unit 25 calculates that the second detection rate of the detected number of the second detection circuits 20 with respect to the total number of the plurality of second detection circuits 20 is 30%.

On the other hand, in the first detection rate calculation unit 15, the first detection rate fluctuates with the input voltage supplied to the processing circuit (not shown). When the first detection rate of the first detection rate calculation unit 15 changes from 0% to 30% or higher, the comparison determination unit 30 determines that the value of the input voltage to the processing circuit (not shown) is equal to or smaller than the value (0.6 [V]) of the threshold voltage.

As described above, the logic detector 100 of the first embodiment according to the present technology includes the first detection rate calculation unit 15, the second detection rate calculation unit 25, and the comparison determination unit 30.

The first detection rate calculation unit 15 calculates the first detection rate of the detected number of the first detection circuits 10 with respect to the total number of the plurality of first detection circuits 10. Also, the second detection rate calculation unit 25 calculates the second detection rate of the detected number of the second detection circuits 20 with respect to the total number of the plurality of second detection circuits 20. The comparison determination unit 30 then compares the first detection rate and the second detection rate, and, when the first detection rate is substantially equal to or higher than the second detection rate, determines the value of the input voltage to be equal to or smaller than the value of the threshold voltage.

With this arrangement, the logic detector 100 can determine the input voltage supplied to the processing circuit to be equal to or lower than the value (0.6 [V], for example) of the threshold voltage, when the first detection rate is substantially equal to or higher than the second detection rate.

Thus, when determining that the input voltage supplied to the processing circuit (not shown) such as a CPU or a DSP is equal to or lower than the value (0.6 [V], for example) of the threshold voltage, the logic detector 100 can stop the processing being performed by the CPU or the DSP, or invalidate the calculation result at that timing.

Particularly, when the first detection rate and the second detection rate are substantially equal, the comparison determination unit 30 can determine the value of the input voltage to be substantially equal to the value of the threshold voltage.

That is, when the first detection rate is substantially equal to a second detection rate of 30%, for example, the comparison determination unit 30 of the logic detector 100 can determine that the input voltage supplied to the processing circuit (not shown) such as a CPU or a DSP is substantially equal to the value (0.6 [V]) of the threshold voltage.

Note that the input voltage to be supplied to the processing circuit (not shown) has been described as an example of the power-supply voltage to be supplied from outside, but is not limited to this. For example, the input voltage to be supplied to the processing circuit may be a voltage generated inside a semiconductor device (an integrated circuit), or may be a shared power supply that shares a power supply with other processing circuits.

3. Second Embodiment (Example 2 of a Detector)

Next, a detector of a second embodiment according to the present technology is a detector that is the same as the first embodiment, except that the detector includes a reference voltage generation circuit, the input voltage is a power-supply voltage, the reference voltage generation circuit generates the predetermined reference voltage from the supplied power-supply voltage, each of the plurality of first detection circuits operates with a clock having a frequency substantially equal to a system clock for operating the processing circuit, each of the plurality of second detection circuits operates with a clock having a lower frequency than the system clock, and the comparison determination unit operates with a clock having a frequency substantially equal to the system clock, and compares the first detection rate and the second detection rate.

With the detector of the second embodiment according to the present technology, the second detection rate can be calculated on the basis of the predetermined reference voltage. Thus, an input voltage outside the guaranteed operating voltage range can be detected, even if the delay time caused in a logic element by a decrease in power-supply voltage varies due to an external factor.

Figure 4:
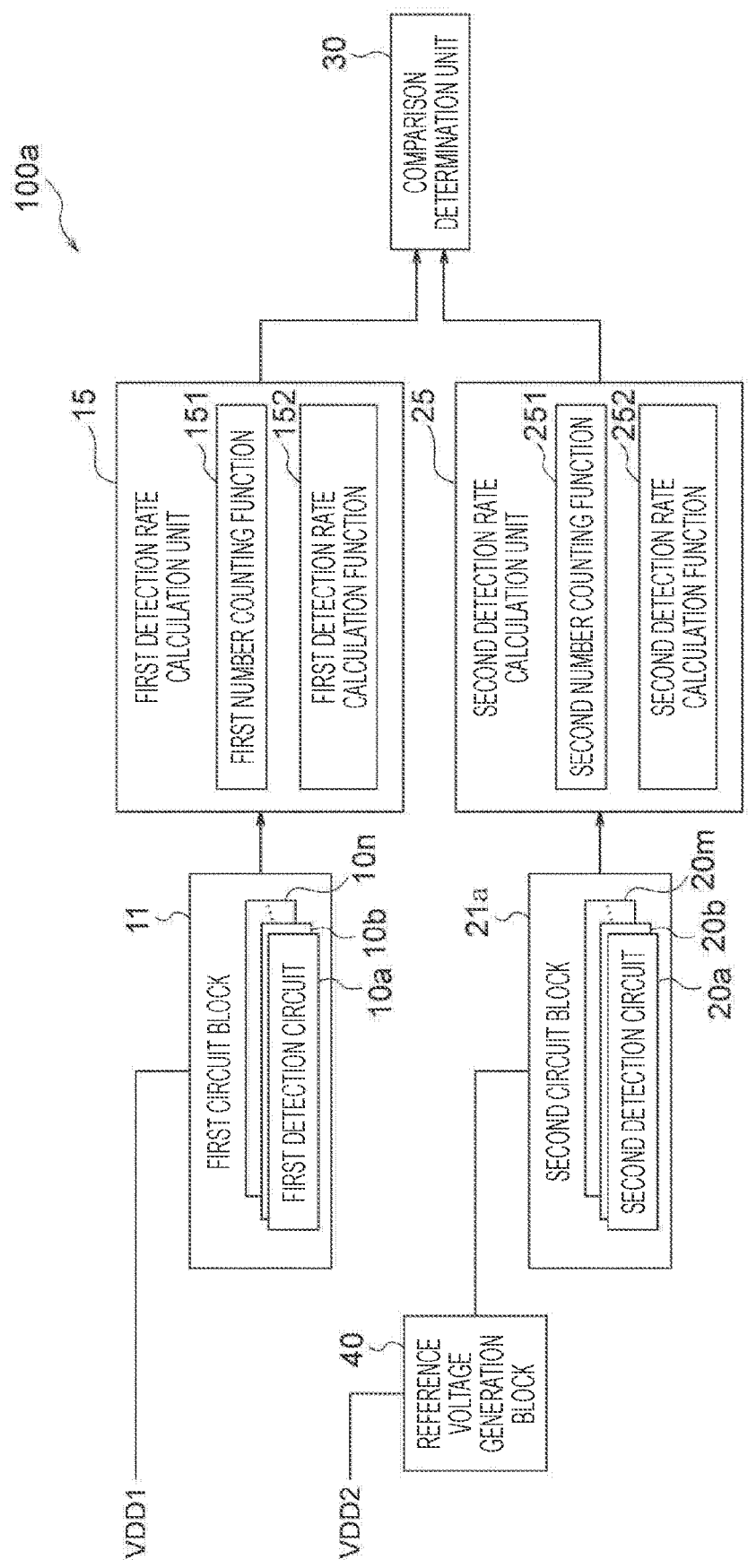
FIG. 4 is a block diagram showing an example configuration of a logic detector that is an example of a detector of a second embodiment according to the present technology.

A logic detector 100a that is an example of a detector of the second embodiment according to the present technology is now described, with reference to FIG. 4. Note that the same components as those in the first embodiment are denoted by the same reference numerals as those in the first embodiment, and explanation of them will not be repeated, as appropriate.

The logic detector 100a of the second embodiment according to the present technology is the same as the logic detector 100 of the first embodiment, except for further including a reference voltage generation circuit 40. A power-supply voltage VDD1 is supplied to the processing circuit (not shown), and the power-supply voltage VDD1 is supplied to the first circuit block 11. The reference voltage generation circuit 40 generates the predetermined reference voltage from a power-supply voltage VDD2 supplied from outside.

As shown in FIG. 4, power-supply voltages are supplied from different power supplies to the first circuit block 11 and a second circuit block 21a, respectively. The power-supply voltage VDD1 is supplied to the first circuit block 11, and the power-supply voltage VDD1 is supplied to each of the plurality of first detection circuits 10 included in the first circuit block 11.

Meanwhile, the power-supply voltage VDD2 is supplied to the reference voltage generation circuit 40. The reference voltage generation circuit 40 generates the predetermined reference voltage from the power-supply voltage VDD2, and supplies the generated predetermined reference voltage to the second circuit block 21a. As a result, the predetermined reference voltage is supplied to each of the plurality of second detection circuits 20 included in the second circuit block 21a.

Also, in the logic detector 100a according to the second embodiment, the first circuit block 11 and the second circuit block 21a are formed in the same semiconductor device (the same integrated circuit), as in the logic detector 100 according to the first embodiment.

Accordingly, in the semiconductor device (an integrated circuit not shown in the drawing) in which the first circuit block 11 and the second circuit block 21a are mounted, the first circuit block 11 and the second circuit block 21a can be considered to have the same detection voltage variation distributions generated by at least the variation caused in the delay time of a logic element (the delay element DL1) by a decrease in the power-supply voltage, or the variation in setup times and hold times of the flip-flops (the first flip-flop FF1 and the second flip-flop FF2). Also, the temperature characteristics of the first circuit block 11 and the temperature characteristics of the second circuit block 21a can be considered to be the same.

Here, in the logic detector 100a of the second embodiment according to the present technology, each of the plurality of first detection circuits 10 included in the first circuit block 11 operates with a clock having a frequency substantially equal to the system clock for operating the processing circuit (not shown). On the other hand, each of the plurality of second detection circuits 20 included in the second circuit block 21a operates with a clock having a lower frequency than the system clock.

Further, the comparison determination unit 30 operates with a clock having a frequency substantially equal to the system clock, and compares the first detection rate and the second detection rate.

The predetermined reference voltage is supplied to the second circuit block 21a, and the second circuit block 21a has the distribution characteristics shown in FIG. 3. Thus, the number of times the second detection rate is calculated can be made smaller than that for the first detection rate of the first circuit block 11, and the second detection rate can be intermittently calculated. Specifically, a clock having a frequency that is a half or a third of the frequency of the clock for each of the plurality of first detection circuits 10 included in the first circuit block 11 is input to each of the plurality of second detection circuits 20 included in the second circuit block 21a. As a result, the logic detector 100a can reduce the number of times the second detection rate is calculated to one-half or one-third.

With this arrangement, the logic detector 100a can reduce the detecting operations synchronized with the clock in the second circuit block 21a as compared with the detecting operations in the first circuit block 11, and thus, power consumption can be lowered.

Also, the logic detector 100a can handle the distribution characteristics shown in FIG. 3 as known data. For example, the second circuit block 21 of the logic detector 100a once detects whether or not the predetermined reference voltage is lower than the threshold voltage, and the second detection rate calculation unit 25 calculates the second detection rate. The logic detector 100a then stores the second detection rate calculated by the second detection rate calculation unit 25 as comparative data into a data storage unit (not shown).

Thus, in the logic detector 100a of the second embodiment according to the present technology, the comparison determination unit 30 can compare the first detection rate calculated with a clock having a frequency substantially equal to the system clock, with the second detection rate calculated with a clock having a lower frequency than the system clock, on the basis of a clock having a frequency substantially equal to the system clock.

When the comparison determination unit 30 determines the first detection rate to be substantially equal to or higher than the second detection rate, the logic detector 100a of the second embodiment according to the present technology can determine the value of the input voltage to be equal to or lower than the value of the threshold voltage.

4. Third Embodiment (Example 3 of a Detector)

A power supply circuit of a third embodiment according to the present technology is a detector that is the same as the first embodiment, except that: the detector includes a reference voltage generation circuit; the input voltage is a power-supply voltage and is also supplied to the reference voltage generation circuit; the reference voltage generation circuit generates the predetermined reference voltage from the input voltage; each of the plurality of first detection circuits operates with a clock having a frequency substantially equal to the system clock for operating the processing circuit; each of the plurality of second detection circuits operates with a clock having a frequency substantially equal to the system clock; when the power-supply voltage fluctuates, the first detection rate calculation unit calculates the first detection rate on the basis of the power-supply voltage after the power-supply voltage fluctuates, and the second detection rate calculation unit calculates the second detection rate on the basis of the power-supply voltage before the power-supply voltage fluctuates; and the comparison determination unit operates with a clock having a frequency substantially equal to the system clock, and compares the first detection rate calculated on the basis of the power-supply voltage after the power-supply voltage fluctuates, with the second detection rate calculated on the basis of the power-supply voltage before the power-supply voltage fluctuates.

With the detector of the third embodiment according to the present technology, an input value outside the guaranteed operating voltage range can be detected, even if the value of the input voltage temporarily fluctuates and turns into a power-supply droop, and the delay time caused in a logic element generated by a decrease in power-supply voltage varies due to an external factor.

Figure 5:
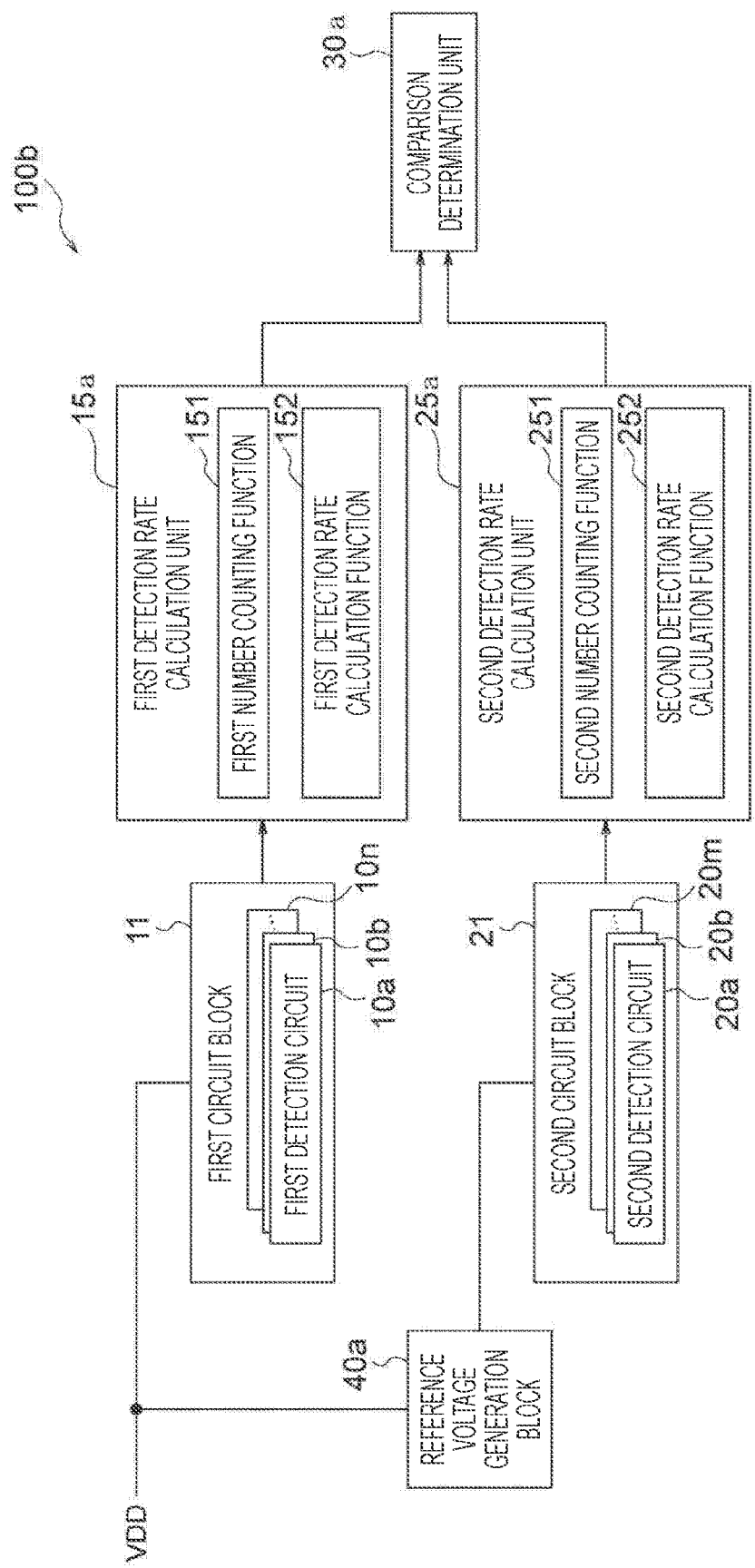
FIG. 5 is a block diagram showing an example configuration of a logic detector that is an example of a detector of a third embodiment according to the present technology.

A logic detector 100b that is an example of a detector of the third embodiment according to the present technology is now described, with reference to FIG. 5. Note that the same components as those in the first embodiment are denoted by the same reference numerals as those in the first embodiment, and explanation of them will not be repeated, as appropriate.

The logic detector 100b of the third embodiment according to the present technology includes a reference voltage generation circuit 40a. The input voltage supplied to the processing circuit (not shown) is a power-supply voltage VDD, and the power-supply voltage VDD is supplied to the first circuit block 11 and the reference voltage circuit 40a. The power-supply voltage VDD is supplied to each of the plurality of first detection circuits 10 included in the first circuit block 11. The reference voltage generation circuit 40a generates the predetermined reference voltage from the power-supply voltage VDD, and supplies the generated predetermined reference voltage to the second circuit block 21a. As a result, the predetermined reference voltage is supplied to each of the plurality of second detection circuits 20 included in the second circuit block 21.

Each of the plurality of first detection circuits 10 included in the first circuit block 11 operates with a clock having a frequency substantially equal to the system clock for operating the processing circuit (not shown). Each of the plurality of second detection circuits 20 included in the second circuit block 21 operates with a clock having a frequency substantially equal to the system clock.

When the power-supply voltage VDD, which is the input voltage, fluctuates, a first detection rate calculation unit 15a calculates the first detection rate on the basis of the power-supply voltage after the power-supply voltage VDD fluctuates. A second detection rate calculation unit 25a calculates the second detection rate on the basis of the power-supply voltage before the power-supply voltage VDD fluctuates. A comparison determination unit 30a then operates with a clock having a frequency substantially equal to the system clock, and compares the first detection rate calculated on the basis of the power-supply voltage after the power-supply voltage VDD fluctuates, with the second detection rate calculated on the basis of the power-supply voltage before the power-supply voltage VDD fluctuates.

As shown in FIG. 5, the power-supply voltage VDD is supplied to the first circuit block 11, and the power-supply voltage VDD is supplied to each of the plurality of first detection circuits 10 included in the first circuit block 11.

Meanwhile, the power-supply voltage VDD is also supplied to the reference voltage generation circuit 40a, and the reference voltage generation circuit 40a generates the predetermined reference voltage from the power-supply voltage VDD, and supplies the generated predetermined reference voltage to the second circuit block 21. Thus, the predetermined reference voltage is supplied to each of the plurality of second circuit blocks 21 included in the second circuit block 21.

Also, in the logic detector 100b according to the third embodiment, the first circuit block 11 and the second circuit block 21 are formed in the same semiconductor device (the same integrated circuit), as in the logic detector 100 according to the first embodiment.

Accordingly, in the semiconductor device (an integrated circuit not shown in the drawing) in which the first circuit block 11 and the second circuit block 21 are mounted, the first circuit block 11 and the second circuit block 21 can be considered to have the same detection voltage variation distributions generated by at least the variation caused in the delay time of a logic element (the delay element DL1) by a decrease in the power-supply voltage, or the variation in setup times and hold times of the flip-flops (the first flip-flop FF1 and the second flip-flop FF2). Also, the temperature characteristics of the first circuit block 11 and the temperature characteristics of the second circuit block 21 can be considered to be the same.

Here, in the logic detector 100b of the third embodiment according to the present technology, each of the plurality of first detection circuits 10 operates with a clock having a frequency substantially equal to the system clock for operating the processing circuit (not shown). Each of the plurality of second detection circuits 20 also operates with a clock having a frequency substantially equal to the system clock.

In this case, if a power-supply droop occurs in the power-supply voltage VDD, and the power-supply voltage VDD fluctuates, for example, the fluctuation might affect the predetermined reference voltage generated by the reference voltage generation circuit 40a. Specifically, when the supplied power-supply voltage VDD temporarily drops, the predetermined reference voltage generated by the reference voltage generation circuit 40a night also temporarily drops.

Therefore, when the power-supply voltage VDD fluctuates, the first detection rate calculation unit 15a calculates the first detection rate on the basis of the power-supply voltage after the power-supply voltage VDD fluctuates. Meanwhile, the second detection rate calculation unit 25a calculates the second detection rate on the basis of the power-supply voltage before the power-supply voltage VDD fluctuates. The comparison determination unit 30a then operates with a clock having a frequency substantially equal to the system clock, and compares the first detection rate calculated on the basis of the power-supply voltage after the power-supply voltage VDD fluctuates, with the second detection rate calculated on the basis of the power-supply voltage before the power-supply voltage VDD fluctuates.

With this arrangement, the logic detector 100b of the third embodiment can eliminate the influence of the power-supply droop and detect an input voltage outside the guaranteed operating voltage range, even if the delay time caused in a logic element by a decrease in the power-supply voltage VDD varies due to an external factor.

In the first circuit block 11 and the second circuit block 21, the timing at which the power-supply droop occurs is set as the nth clock pulse in the system clock, for example. The timing before the power-supply droop occurs is then expressed as the (n−1)th clock pulse or the (n−2)th clock pulse. Accordingly, the comparison determination unit 30a can use this timing before the power-supply droop occurs as the second detection rate calculated on the basis of the power-supply voltage before the power-supply voltage VDD fluctuates.

When the power-supply droop occurs, the comparison determination unit 30a can also use the second detection rate stored as the known data (past data) explained in the second embodiment, as the second detection rate calculated before the power-supply voltage VDD fluctuates.

The comparison determination unit 30a can recognize how much the input voltage has dropped, by comparing the first detection rate calculated on the basis of the power-supply voltage after the power-supply voltage VDD fluctuates, with the second detection rate calculated on the basis of the power-supply voltage before the power-supply voltage VDD fluctuates.

For example, in a case where the second reference detection rate SH2 shown in FIG. 3 is used, and the first detection rate is 60%, the comparison determination unit 30a can determine that the input voltage supplied to the first circuit block 11 (the processing circuit) has dropped to 0.55 [V] (see FIG. 3). Further, in a case where the first detection rate is 20%, the comparison determination unit 30a determines that the input voltage supplied to the first circuit block 11 (the processing circuit) has dropped to 0.65 [V] (see FIG. 3).

Note that, as for the second detection rate to be compared by the comparison determination unit 30a, a detection rate obtained from a moving average or a detection rate that is the median in a certain voltage range can also be used as the second detection rate calculated before the power-supply voltage VDD fluctuates, for example. Note that the moving average is the data obtained by smoothing the second detection rate as time-series data.

As described above, the logic detector 100b of the third embodiment according to the present technology can detect an input voltage outside the guaranteed operating voltage range, even if the delay time caused in a logic element by a decrease in the power-supply voltage VDD varies due to an external factor.

Note that embodiments according to the present technology are not limited to the embodiments described above, and various modifications may be made to them without departing from the scope of the present technology.

Also, the first to third embodiments according to the present technology are not limited to the embodiments described above, and various modifications may be made to them without departing from the scope of the present technology.

Further, the advantageous effects described in this specification are merely examples, and the advantageous effects of the present technology are not limited to them and may include other effects.

The present technology may also be embodied in the configurations described below.

[1] A detector including:
a plurality of first detection circuits;
a first detection rate calculation unit;
a plurality of second detection circuits;
a second detection rate calculation unit; and
a comparison determination unit,
in which each first detection circuit of the plurality of first detection circuits detects whether or not an input voltage supplied to a processing circuit has a value outside a guaranteed operating range in which a normal operation is performed at the processing circuit;
the first detection rate calculation unit counts the number of the first detection circuits that have detected that the input voltage has a value outside the guaranteed operating range, and calculates a first detection rate of the detected number of the first detection circuits with respect to the total number of the plurality of first detection circuits,
each second detection circuit of the plurality of second detection circuits detects whether or not a predetermined reference voltage supplied is lower than a threshold voltage for determining the guaranteed operating range,
the second detection rate calculation unit counts the number of the second detection circuits that have detected that the predetermined reference voltage is lower than the threshold voltage, and calculates a second detection rate of the detected number of the second detection circuits with respect to the total number of the plurality of second detection circuits, and
the comparison determination unit compares the first detection rate and the second detection rate, and, when the first detection rate is substantially equal to or higher than the second detection rate, determines the value of the input voltage to be equal to or smaller than the value of the threshold voltage.

[2] The detector according to [1], in which, when the first detection rate and the second detection rate are substantially equal, the comparison determination unit determines that the value of the input voltage and the value of the threshold voltage are substantially equal.

[3] The detector according to [1] or [2], in which
each first detection circuit of the plurality of first detection circuits is formed with a first logic circuit group,
each second detection circuit of the plurality of second detection circuits is formed with a second logic circuit group, and
the first logic circuit group and the second logic circuit group have substantially the same configuration.

[4] The detector according to [3], in which
the first logic circuit group and the second logic circuit group each include a first flip-flop, a second flip-flop, and a delay element, and
the delay element is disposed between an output of the first flip-flop and an input of the second flip-flop.

[5] The detector according to any one of [1] to [4], further including a reference voltage generation circuit,
in which the input voltage is a power-supply voltage,
the reference voltage generation circuit generates the predetermined reference voltage from the power-supply voltage supplied,
each first detection circuit of the plurality of first detection circuits operates with a clock having a frequency substantially equal to a system clock for operating the processing circuit,
each second detection circuit of the plurality of second detection circuits operates with a clock having a lower frequency than the system clock, and
the comparison determination unit operates with a clock having a frequency substantially equal to the system clock, and compares the first detection rate and the second detection rate.

[6] The detector according to any one of [1] to [4], further including a reference voltage generation circuit,
in which the input voltage is a power-supply voltage, and is also supplied to the reference voltage generation circuit,
the reference voltage generation circuit generates the predetermined reference voltage from the input voltage,
each first detection circuit of the plurality of first detection circuits operates with a clock having a frequency substantially equal to a system clock for operating the processing circuit,
each second detection circuit of the plurality of second detection circuits operates with a clock having a frequency substantially equal to the system clock,
when the power-supply voltage fluctuates, the first detection rate calculation unit calculates the first detection rate on the basis of the power-supply voltage after the power-supply voltage fluctuates, and the second detection rate calculation unit calculates the second detection rate on the basis of the power-supply voltage before the power-supply voltage fluctuates; and
the comparison determination unit operates with a clock having a frequency substantially equal to the system clock, and compares the first detection rate calculated on the basis of the power-supply voltage after the power-supply voltage fluctuates, with the second detection rate calculated on the basis of the power-supply voltage before the power-supply voltage fluctuates.

REFERENCE SIGNS LIST

10 First detection circuit
11 First circuit block
15 First detection rate calculation unit
20 Second detection circuit
21 Second circuit block
25 Second detection rate calculation unit
30 Comparison determination unit
40 Reference voltage generation circuit

The invention claimed is:

1. A detector comprising:
a plurality of first detection circuits;
a first detection rate calculation unit;
a plurality of second detection circuits;
a second detection rate calculation unit; and
a comparison determination unit,
wherein each first detection circuit of the plurality of first detection circuits detects whether or not an input voltage supplied to a processing circuit has a value outside a guaranteed operating range in which a normal operation is performed at the processing circuit,
the first detection rate calculation unit counts the number of the first detection circuits that have detected that the input voltage has a value outside the guaranteed operating range, and calculates a first detection rate of the detected number of the first detection circuits with respect to the total number of the plurality of first detection circuits,
each second detection circuit of the plurality of second detection circuits detects whether or not a predetermined reference voltage supplied is lower than a threshold voltage for determining the guaranteed operating range,
the second detection rate calculation unit counts the number of the second detection circuits that have detected that the predetermined reference voltage is lower than the threshold voltage, and calculates a second detection rate of the detected number of the second detection circuits with respect to the total number of the plurality of second detection circuits, and
the comparison determination unit compares the first detection rate and the second detection rate, and, when the first detection rate is substantially equal to or higher than the second detection rate, determines the value of the input voltage to be equal to or smaller than a value of the threshold voltage.

2. The detector according to claim 1, wherein, when the first detection rate and the second detection rate are substantially equal, the comparison determination unit determines that the value of the input voltage and the value of the threshold voltage are substantially equal.

3. The detector according to claim 1, wherein
each first detection circuit of the plurality of first detection circuits is formed with a first logic circuit group,
each second detection circuit of the plurality of second detection circuits is formed with a second logic circuit group, and
the first logic circuit group and the second logic circuit group have substantially the same configuration.

4. The detector according to claim 3, wherein
the first logic circuit group and the second logic circuit group each include a first flip-flop, a second flip-flop, and a delay element, and
the delay element is disposed between an output of the first flip-flop and an input of the second flip-flop.

5. The detector according to claim 1, further comprising a reference voltage generation circuit,
wherein the input voltage is a power-supply voltage,
the reference voltage generation circuit generates the predetermined reference voltage from the power-supply voltage supplied,
each first detection circuit of the plurality of first detection circuits operates with a clock having a frequency substantially equal to a system clock for operating the processing circuit,
each second detection circuit of the plurality of second detection circuits operates with a clock having a lower frequency than the system clock, and
the comparison determination unit operates with a clock having a frequency substantially equal to the system clock, and compares the first detection rate and the second detection rate.

6. The detector according to claim 1, further comprising a reference voltage generation circuit,
wherein the input voltage is a power-supply voltage, and is also supplied to the reference voltage generation circuit,
the reference voltage generation circuit generates the predetermined reference voltage from the input voltage,
each first detection circuit of the plurality of first detection circuits operates with a clock having a frequency substantially equal to a system clock for operating the processing circuit,
each second detection circuit of the plurality of second detection circuits operates with a clock having a frequency substantially equal to the system clock,
when the power-supply voltage fluctuates, the first detection rate calculation unit calculates the first detection rate on a basis of the power-supply voltage after the power-supply voltage fluctuates, and the second detection rate calculation unit calculates the second detection rate on a basis of the power-supply voltage before the power-supply voltage fluctuates; and
the comparison determination unit operates with a clock having a frequency substantially equal to the system clock, and compares the first detection rate calculated on a basis of the power-supply voltage after the power-supply voltage fluctuates, with the second detection rate calculated on a basis of the power-supply voltage before the power-supply voltage fluctuates.

* * * * *